United States Patent [19]

McClure

[11] Patent Number: 5,568,061
[45] Date of Patent: Oct. 22, 1996

[54] REDUNDANT LINE DECODER MASTER ENABLE

[75] Inventor: David C. McClure, Carrollton, Tex.

[73] Assignee: SGS-Thomson Microelectronics, Inc., Carrollton, Tex.

[21] Appl. No.: 492,219

[22] Filed: Jun. 19, 1995

Related U.S. Application Data

[63] Continuation of Ser. No. 129,766, Sep. 30, 1993, abandoned.
[51] Int. Cl.⁶ .............................................. H03K 19/003
[52] U.S. Cl. .................... 326/13; 365/200; 365/230.06; 365/108
[58] Field of Search .................... 307/441, 443, 307/449; 365/200, 230.06; 326/13, 106, 108

[56] References Cited

U.S. PATENT DOCUMENTS

| | | | |
|---|---|---|---|
| 4,714,839 | 12/1987 | Chung | 307/441 |
| 5,257,228 | 10/1993 | Sukegawa | 365/230.06 |
| 5,262,994 | 11/1993 | McClure | 307/449 |
| 5,274,594 | 12/1993 | Yanagisawa | 365/230.06 |
| 5,311,472 | 5/1994 | Ota | 365/230.06 |

OTHER PUBLICATIONS

Toshiba Circuit Diagram, Jan. 1992.

*Primary Examiner*—Edward P. Westin
*Assistant Examiner*—Andrew Sanders
*Attorney, Agent, or Firm*—Kenneth C. Hill; Lisa K. Jorgenson

[57] ABSTRACT

A master enable circuit is provided which receives multiple enable signal inputs while matching the redundant decoder enable delay with decoder enable delay. A master enable circuit contains a hard coded master fuse, driver transistor, and a multiple input logic gate. A blown master fuse forces the driver output to an enable state. When the proper select signals are then received by the logic gate, the decoder is enabled to allow selection of the redundant row without introducing a mismatch of redundant and normal line select times.

12 Claims, 2 Drawing Sheets

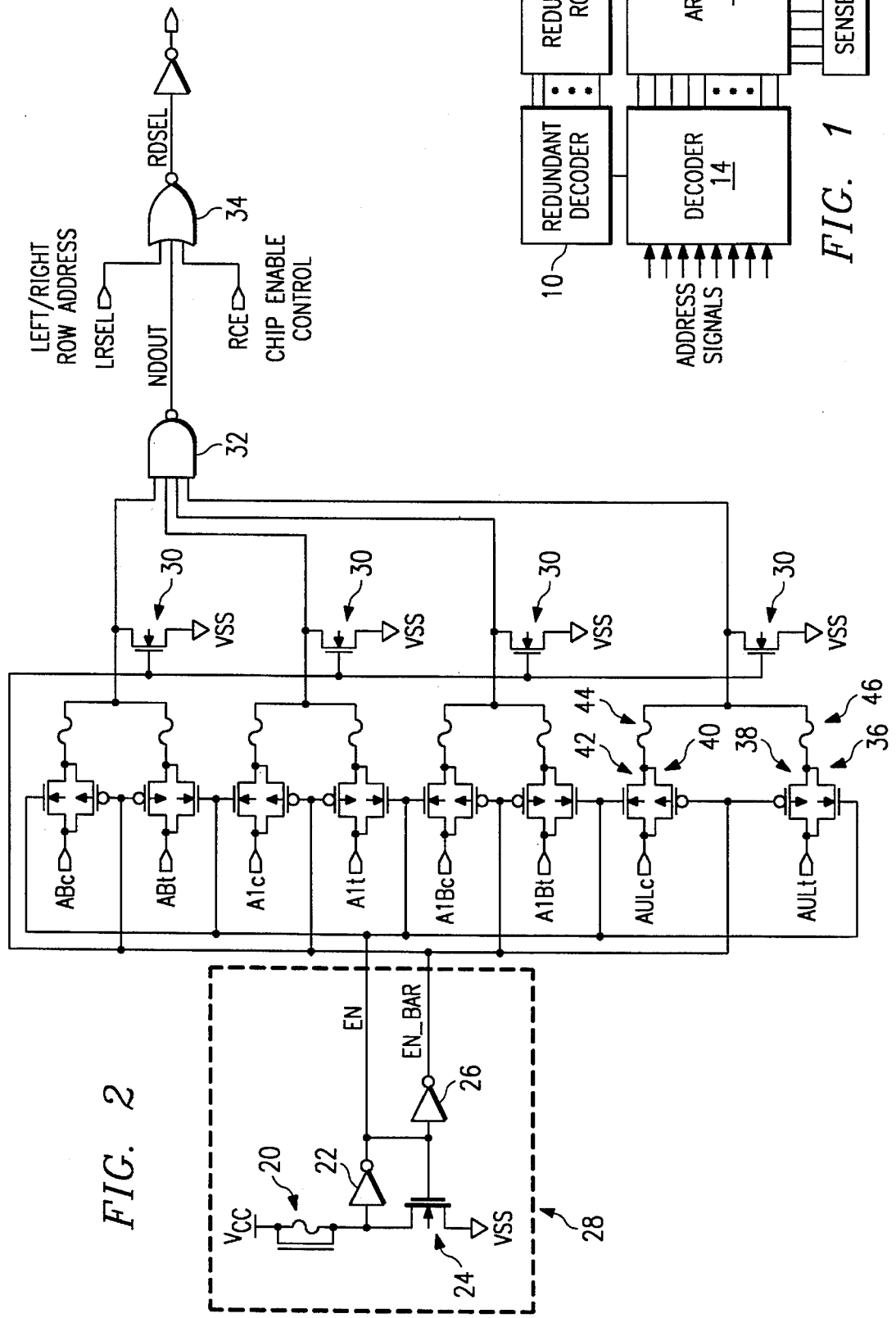

5,568,061

REDUNDANT LINE DECODER MASTER ENABLE

This is a continuation of application Ser. No. 08/129,766, filed Sep. 30, 1993.

BACKGROUND OF THE INVENTION

1. Field of the Invention

The present invention relates in general to redundant line decoding in a semiconductor memory array and in particular to a redundant decoder master enable circuit. Still more particularly, the present invention relates to a redundant decoder master enable circuit which allows multiple enable signal inputs.

2. Description of the Prior Art

Modern VLSI semiconductor memories typically range in size from 64 Kb to 4 Mb. Processing defects in SRAM and DRAM semiconductor memories can significantly reduce the processing yield in such large scale memory arrays. In order to improve the processing yield of memory chips, various methods of error correction have been created to improve yield. These include electrical or 'soft' error correcting whereby software corrects for physical defects, and 'hard' error correcting whereby defective circuit elements are replaced with redundant elements included on the chip. The use of soft or hard error correcting can result in lower capital manufacturing cost and earlier introduction of new products on existing wafer fab lines or in new process technologies.

Yield enhancement by 'hard' error correcting on a memory chip is typically produced by including redundant rows and columns within the memory array. A few redundant rows or columns can significantly enhance yield of a memory circuit since many devices are rejected for single bit failure or failures in a single row or column. These redundant rows or columns can be added to the memory design to replace defective rows or columns which are identified at electrical test after wafer processing. First, the defective row or column is disconnected from the array. This is accomplished by one of three methods: current blown fuses, laser blown fuses, and laser annealed resistor connections. Then a redundant row or column is enabled and programmed with the defective row or column address.

The implementation of redundant lines in a memory array can impair the chip's speed if these lines are a significant distance away from the lines they are replacing or if the circuit path for the redundant lines contains additional devices. The attempt is usually made to locate the redundant elements in blocks of the array near the locations they will replace in order to reduce the signal path length. Also, additional signals such as "chip enable" or "left/right row address" are needed to enable the line. These additional signals require an additional logic device to be placed in the signal path or that the fan-in on an existing logical device be increased. Both of these options introduce an additional delay in the signal path. This creates a mismatch between the signal path delay time through the redundant line and the non-redundant row or column. The result is a slower speed memory.

It would be desirable to provide a redundant line enable circuit which allows multiple enable signal inputs without introducing a propagation delay in the line select signal path. Such a circuit would allow for yield enhancement by 'hard' error correction without resulting in a reduced memory chip speed.

SUMMARY OF THE INVENTION

Therefore, in accordance with the present invention, in a redundant decoder which enables a redundant row or column to replace a defective row or column, a master enable circuit is provided which receives multiple enable signal inputs while matching the redundant decoder enable delay with decoder enable delay. A master enable circuit contains a hard coded master fuse, driver transistor, and a multiple input logic gate. A blown master fuse forces the driver output to an enable state. When the proper select signals are then received by the logic gate, the decoder is enabled to allow selection of the redundant row without introducing a mismatch of redundant and normal line select times.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a block diagram of a semiconductor memory array containing redundant rows and a redundant row decoder containing the redundant decoder master enable according to the present invention;

FIG. 2 is a schematic diagram of a redundant line decoder used in the prior art.

DESCRIPTION OF THE PREFERRED EMBODIMENT

Figure 3:
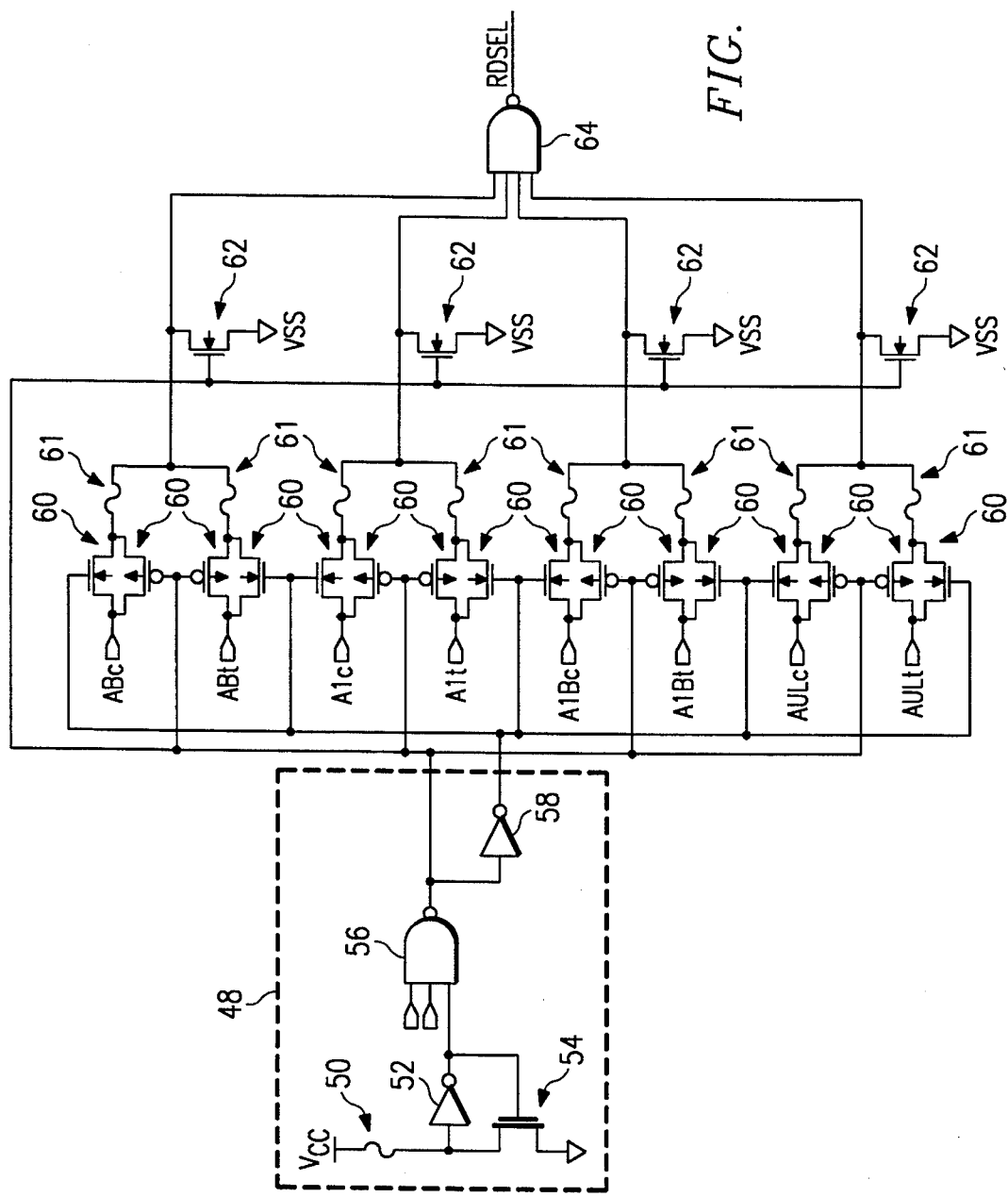
FIG. 3 is a schematic diagram of the redundant line decoder as described in a preferred embodiment of the present invention.

With reference now to the figures and in particular with reference to FIG. 1, there is depicted a block diagram of a semiconductor memory array designed with redundant rows and their corresponding decoder. A redundant row in redundant rows 12 can be added to a memory design to replace defective cells in array 16 which are identified at the electrical test stage after wafer processing. The redundant line decoder 10 is programmed by blowing selected fuses to enable certain redundant rows 12 and to assign them addresses to which they will respond. When the address sent to decoder 14 and redundant decoder 10 corresponds to an address assigned to a redundant row, redundant decoder 10 sends a row select signal to redundant rows 12. Decode circuitry 14 is programmed to not respond to the address assigned to a redundant row. Sense amplifiers 18 read each column of the selected redundant row.

FIG. 2 shows a schematic diagram of a redundant row decoder used in the prior art for a single redundant row. When the redundant row is disabled, master fuse 20 provides a high voltage signal, Vcc, to inverting amplifier 22, creating a low enable signal output from master enable circuit 28 and a high complement enable signal from inverting amplifier 26. This causes pass-gates 36, 38, 40, and 42 to be turned off. Similarly, all the pass-gates connected in parallel with these pass-gates, as seen in FIG. 2, are turned off. Also, inverting amplifier 26 turns on pull-down transistors 30. The inputs of NAND gate 32 are held low, which in this case is set to ground, and a high value is output from NAND gate 32 at NDOUT. A high NDOUT input into NOR gate 34 prevents any redundant row select signal from being output from the redundant decoder.

A redundant row is selected at wafer electrical test by programming the redundant line decoder to enable a redundant row. Master fuse 20 is blown which turns on all the pass-gates including pass-gates 36 and 38, and turns off the n-channel pull-down transistors 30, thereby enabling the redundant row decoder to receive an address. The voltage Vcc, which had been input to inverting amplifier 22 and the drain terminal of transistor 24, is disconnected from the circuit. The resulting high output of inverter 22 turns on the gate to transistor 24, locking the output of inverter 22 high. Inverter 22 and inverting amplifier 26 act as drivers to provide the master enable signal EN and the complement of the master enable signal EN_BAR respectively. The enable signal is applied to the gate terminals of the NMOS pass-gate transistors 36, and the master enable complement EN_BAR is applied to the PMOS pass-gate transistors 38 at their gate terminals allowing the address signal AULt to be passed through the transistor pair. The low output of inverting amplifier 26 turns off pull-down transistors 30 and, as will be explained below, allows either the address signal AULt or complementary address signal AULc to pass through fuse 46 or fuse 44 and into NAND gate 32. Similarly, a plurality of pass-gates will allow multiple address signals to be passed into the NAND gate input terminals as is shown in FIG. 2.

The decoder is programmed to respond to a particular assigned row address as follows. The assigned row address is comprised of a sequence of binary bits typically in groups of four, eight, or sixteen bits. In the redundant line decoder of FIG. 2, one of those bits would be sent as signal AULt to the transistor pair 36 and 38. The complement to that address bit would be sent as signal AULc input into transistors 40 and 42. To program the decoder with an assigned address containing a binary one for this address bit (High AULt), fuse 44 would be blown to disconnect the complementary signal AULc. Accordingly, the address bit AULt is directly connected to NAND gate 32. If a logic zero is required at the address bit for the selected address, fuse 46 is blown instead of fuse 44 in order to directly connect the complementary signal AULc to NAND gate 32. Similarly, the fuse is blown along the "true" line or along the "complementary" line in order to program a binary zero or one respectively for each address bit in the programmed address. When the programmed address is sent to the redundant line decoder, all inputs to NAND gate 32 are summed, creating a low signal NDOUT indicating a properly addressed row.

In addition to the proper address, typical semiconductor memory designs require additional signals to properly enable a row or column within the memory array. In FIG. 2, these signals can be seen as LRSEL (left/right row address) and RCE (chip enable control) which are input together with the address signal NDOUT into NOR gate 34. When these signals indicate a properly selected row or column, NOR gate 34 outputs a logic high redundant select signal RDSEL which enables the row or column.

The need for this additional logic gate in the decoder select signal path creates an additional delay in the propagation of the select signal which is not present in decoder 14 for non-redundant rows in array 16. This mismatch in propagation creates a delay in selecting redundant rows, and thus, the overall memory speed is reduced.

An alternative design which would remove the need for an additional logic gate is to increase the fan-in of inputs into NAND gate 32 to include the additional select signals. However, such an implementation creates excessive fan-in for the NAND gate and unduly slows the signal propagation through the NAND gate. This is partially due to the excessive stack of series transistors required to implement the gate. This delay creates a mismatch with normal path delay, reducing memory array speed.

Referring now to FIG. 3, there is illustrated a schematic diagram of the redundant line decoder of the present invention. Although the preferred embodiment describes a redundant row decoder, those skilled in the art will appreciate that the decoder is equally capable of operating as a redundant column decoder.

All enabling of the redundant row is performed in the master enable circuit 48 within the redundant line decoder. The master fuse 50, inverting amplifier 52, and transistor 54 operate to hard-code the redundant row into the memory chip. The enable state is hard-coded in the circuit by blowing fuse 50. The output of amplifier 52 shifts high, and transistor 54 turns on, locking the input to inverter amplifier 52 low. The output of master enable circuit 48 consists of NAND gate 56 and inverting amplifier 58. After the enable state is set, NAND gate 56 is enabled such that when additional enable or select signals such as ROE or LRSEL are received, NAND gate 56 outputs a low signal and inverting amplifier 58 is turned high. This results in all pass-gates 60 turning on, and all pull-down transistors turning off. The decoder is now capable of receiving address signals AOc through AULt. When a programmed address is received, the decoder outputs a redundant row select signal RESEL to the redundant row from NAND gate Although the disclosed embodiment shows a NAND gate 64, the gate used may be a different polarity device or a different logic gate altogether depending on the designer's circuit implementation of memory array addressing.

When the redundant row is disabled, master fuse 50 remains in place. Vcc holds the output of inverting amplifier 52 low, locking the output of NAND gate 56 high, and thereby turning off pass-gates 60 and turning on pull-down transistors 62.

The redundant line decoder master enable of the present invention allows for hard-coding the enable state by blowing the master fuse and inputting additional signals to select the redundant row, but it has eliminated the need for an additional logic gate within the decoder address signal path, or for increasing the fan-in on existing logic gates. This design enhances the speed of the error corrected memory array by allowing matching of redundant and normal decoder select signal delay and normal decoder sel placement of both the master fuse and the additional enable signal inputs within the redundant master enable circuit allows for a more efficient logical combination of signals within redundant line decoder design.

It will be appreciated by those skilled in the art that the type of address signals input into the decoder or the method of programming the decoder as described in the preferred embodiment are not restricted to those particular types of signals or method. For example, the signals input to the pass-gates 60 may be predecoded address signals which have been processed at a previous stage of the addressing process of the memory array. The programming procedure for implementing this type of decoder using predecoded signals may require a different protocol for blowing fuses 61. Moreover, although the master enable circuit disclosed in the preferred embodiment was utilized within a redundancy decoder, it will be appreciated by those skilled in the art that the master enable may be used with a variety of decoder circuits and even as an enable circuit for other electronic devices.

While the invention has been particularly shown and described with reference to a preferred embodiment, it will be understood by those skilled in the art that various changes in form and detail may be made therein without departing from the spirit and scope of the invention.

What is claimed is:

1. A redundant line decoder comprising:

a programmable master enable circuit that outputs a master enable signal in an enabling state when the master enable circuit is programmed to an enable state and when an additional enable signal has an enabled state;

a decoder circuit programmed with an address to which the decoder is responsive, and receiving the master enable signal and address signals, and outputting a redundant line select signal when the programmed address is received while the master enable signal is in an enabling state, and wherein no enable signals other than the master enable signal are received by the decoder circuit; and a word line that receives the redundant line select signal, and that is selected by receiving only the redundant line select signal.

2. A redundant line decoder according to claim 1, wherein the master enable circuit comprises:

a master fuse having a first end connected to a first voltage rail;

a transistor having an input terminal, a first terminal connected to a second end of the master fuse, and a second terminal connected to a second voltage rail;

an inverting amplifier having an input connected to the transistor first terminal and an output connected to the transistor input terminal; and a logic gate having as inputs at least one additional enable signal and the output from the inverting amplifier, and outputting a master enable signal which indicates a redundant decoder is enabled when the logic gate inputs indicate the redundant line decoder is enabled.

3. A redundant line decoder according to claim 2, wherein the logic gate comprises a NAND gate.

4. A redundant line decoder according to claim 2, wherein the transistor is a MOSFET.

5. A redundant line decoder according to claim 2, further comprising an inverting amplifier connected to the output of the logic gate, whereby both the master enable signal and its complement may be output from the master enable circuit.

6. A redundant line decoder according to claim 1, wherein the decoder circuit comprises a plurality of pass-gate transistors connected between the address signals and a NAND gate, the transistors being controlled by the master enable signal.

7. A redundant line decoder according to claim 6, wherein the pass-gate transistors comprise a plurality of PMOS transistors and NMOS transistors connected in complementary pairs between the address signals and the decode circuit, the PMOS transistors being controlled by a decoder enable signal and the NMOS transistors being controlled by a complement to the decoder enable signal.

8. A redundant line decoder according to claim 6, further comprising a plurality of locking transistors connected between the pass-gate transistors and ground, the locking transistors being controlled by the master enable signal.

9. A redundant line decoder according to claim 1, wherein the decoder circuit comprises:

means for selecting address signals corresponding to a programmed address; and a logic gate having inputs of the selected address signals, the logic gate outputting the redundant line select signal when the selected signals are received.

10. A redundant line decoder according to claim 9, wherein the means for selecting comprises fuses connected in-line with each of the address signals.

11. A redundant line decoder according to claim 9, further comprising means for selecting address signals and complementary address signals corresponding to the programmed address.

12. A redundant line decoder according to claim 9, further comprising means for selecting predecoded signals corresponding to the programmed address.

* * * * *